United States Patent
Alleyne et al.

(10) Patent No.: US 7,600,181 B2
(45) Date of Patent: Oct. 6, 2009

(54) CIRCUIT TO REDUCE RAIL NOISE VOLTAGE SPIKES DUE TO SWITCHING ON AN INPUT-OUTPUT BUS

(75) Inventors: Brian Derek Alleyne, Los Gatos, CA (US); John Christian Holst, San Jose, CA (US); Hai Ngoc Nguyen, Palo Alto, CA (US)

(73) Assignee: Cisco Technology, Inc., San Jose, CA (US)

( * ) Notice: Subject to any disclaimer, the term of this patent is extended or adjusted under 35 U.S.C. 154(b) by 665 days.

(21) Appl. No.: 11/421,431

(22) Filed: May 31, 2006

(65) Prior Publication Data
US 2007/0288790 A1    Dec. 13, 2007

(51) Int. Cl.
*H03M 7/00*    (2006.01)
(52) U.S. Cl. .............................. 714/811; 341/50; 341/58
(58) Field of Classification Search .................. 714/811; 341/50, 58, 93
See application file for complete search history.

(56) References Cited

U.S. PATENT DOCUMENTS

| | | | | |
|---|---|---|---|---|
| 5,574,921 A | * | 11/1996 | Curran | 713/320 |
| 5,917,364 A | * | 6/1999 | Nakamura | 327/415 |
| 6,118,297 A | * | 9/2000 | Schenck | 326/35 |
| 6,243,779 B1 | * | 6/2001 | Devanney et al. | 710/305 |
| 6,489,900 B2 | * | 12/2002 | Shin et al. | 341/50 |
| 6,614,369 B1 | * | 9/2003 | Widmer | 341/59 |
| 7,221,292 B2 | * | 5/2007 | Hein | 341/55 |
| 7,397,395 B2 | * | 7/2008 | Tschanz et al. | 341/51 |
| 7,406,608 B2 | * | 7/2008 | Joshi, Mayur | 713/300 |
| 7,408,482 B2 | * | 8/2008 | Park et al. | 341/55 |
| 7,471,219 B1 | * | 12/2008 | Lastras-Montano | 341/83 |
| 7,501,963 B1 | * | 3/2009 | Hollis | 341/55 |

* cited by examiner

*Primary Examiner*—Stephen M Baker
(74) *Attorney, Agent, or Firm*—Schwegman, Lunbderg & Woessner, P.A.

(57) ABSTRACT

A circuit to reduce noise spikes on the power and ground rails of a chip when switching over an input-output bus, the circuit comprising an encoder to encode a word before transmission over the input-output bus so that the difference in the number of 1 bits and the number of 0 bits in the encoded word is upper bounded, where the upper bound is less than the length of the original word before encoding. An embodiment circuit to implement this encoding comprises partitioning the word into a plurality of smaller words. An embodiment circuit further comprises a number of stages, where in the first stage, there are a plurality of encoders to encode in pair-wise fashion the smaller words. Additional stages also comprise a plurality of encoders, each encoder performing a pair-wise encoding of words outputted by a previous stage. Other embodiments are described and claimed.

21 Claims, 7 Drawing Sheets

CIRCUIT TO REDUCE RAIL NOISE VOLTAGE SPIKES DUE TO SWITCHING ON AN INPUT-OUTPUT BUS

FIELD

Example embodiments relate to circuits, or more particularly, to circuits for input-output busses.

BACKGROUND

On a single-ended data bus, or I/O (input-output bus), when a majority of the data signals on the bus switch to HIGH from LOW, or to LOW from HIGH, there may be an accompanying noise spike on the voltage supply lines and the ground lines. This may adversely affect power supply integrity, as well as signal integrity. For example, if all the data bits on a bus were to switch from HIGH to LOW, the on-chip ground rail voltage and power rail voltage may bounce up due to the combination of the capacitance between the rails and the inductances in the leads.

The above-described rail and ground bounce is substantially mitigated by using differential signaling. However, this requires twice as many pins, and a data bus twice as wide, as for the case of using single-ended signaling. It is desirable to mitigate noises spikes on the power and ground rails when signaling over an I/O bus without resorting to differential signaling.

DESCRIPTION OF EMBODIMENTS

Figure 1:
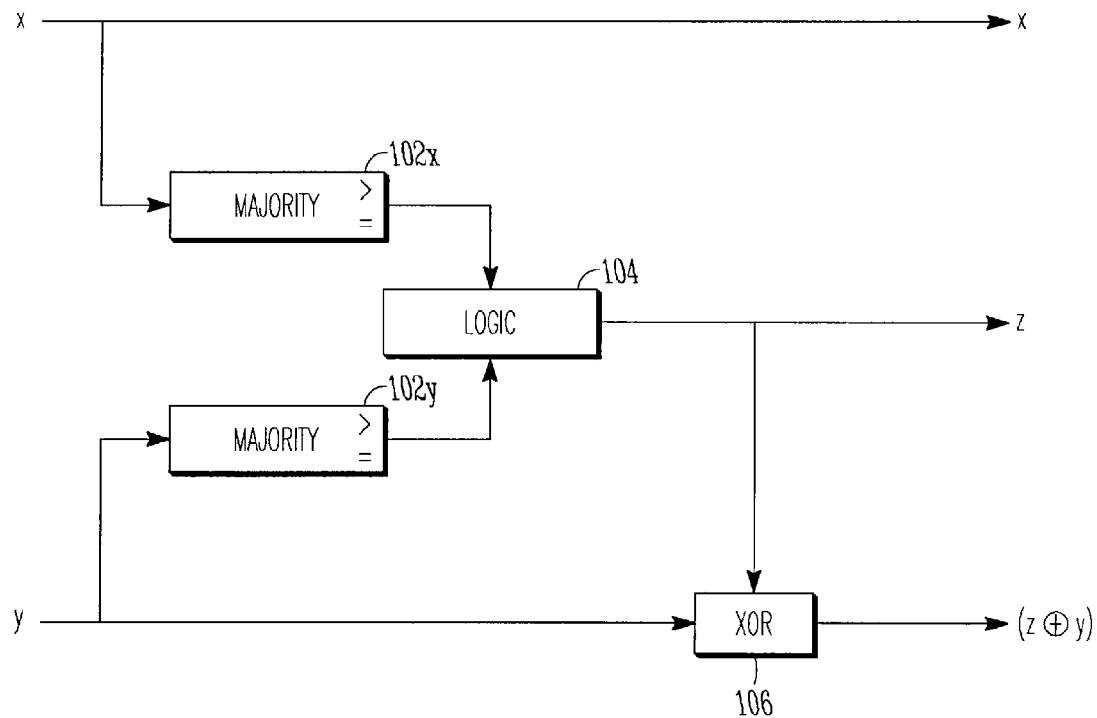
FIG. 1 illustrates a portion of an encoding circuit according to an example embodiment.

First, an example mathematical framework is developed. We will refer to the set of bits represented by the voltages on an I/O bus as a word. In general, a word may comprise an arbitrary number of bits. A word may be thought of as a list or vector, whose bits are bits, where for some index i the $i^{th}$ bit of a word is the bit represented by the voltage on the $i^{th}$ transmission line of the corresponding bus. This is not to be confused with the definition of a word used in describing computer architecture. To help quantify the effect discussed previously, whereby switching a bus from one word to another word may cause the power and ground rail voltages to bounce up or down, it is useful to define a metric B between any two equal length words x and y as the number of bits in which x and y differ. We may write the metric between x and y as $B(x, y)$.

For any word x, let $Z(x)$ denote the number of 0's in x and $O(x)$ denote the number of 1's in x. For any two equal length words x and y, $$B(x,y)=\text{abs}(Z(x)-Z(y))=\text{abs}(O(x)-O(y)).$$

The above relation follows from the observation that $B(x, y)$ is invariant under permutations of the bits in x or y.

Note that if an I/O bus is driven from word x to word y, the power rail voltage or the ground rail voltage may in general have a relatively large bounce if $B(x,y)$ is relatively large. Consequently, it is desirable for the metric B between sequential words on a bus to be relatively small. A useful mnemonic is to associate the letter "B" in the metric with "badness", so that the larger the value of $B(x, y)$, the more likely the power or ground rail voltages will bounce when the I/O bus is driven from word x to y, or from word y to x.

For any word x, define the residue R as the total number of 1's in x minus the total number of 0's in x. Note that the residue may be negative or positive. For any word x, define the imbalance I as the absolute magnitude of the difference between the number of 1's and the number of 0's. We may write the residue and imbalance of a word x as $R(x)$ and $I(x)$, respectively. From the definitions of residue and imbalance, the following relations hold:

$$I(x)=\text{abs}(R(x)),$$

$$R(x)=-R(\bar{x}),$$

$$I(x)=I(\bar{x}),$$

$$R(x.y)=R(x)+R(y),$$

where $\bar{x}$ denotes the bit-wise Boolean complement of x, and x.y denotes the concatenation of words x and y.

Suppose the imbalance of x and y is upper bounded by some number c. The word x.y formed by the concatenation of x and y may have an imbalance of up to 2c. However, by using an additional "conditioning" bit, the words x.0.y or x.1.$\bar{y}$ will have an imbalance upper bounded by c. The choice of conditioning bit is illustrated by the following table.

TABLE 1

| Word x, $(I(x) \leq c)$ | Word y, $(I(y) \leq c)$ | Concatenation | Imbalance |
|---|---|---|---|
| $R(x) < 0$ | $R(y) < 0$ | x.1.$\bar{y}$ | $I(x.1.\bar{y}) \leq c$ |
| $R(x) > 0$ | $R(y) > 0$ | x.1.$\bar{y}$ | $I(x.1.\bar{y}) \leq c$ |
| $R(x) < 0$ | $R(y) > 0$ | x.0.y | $I(x.0.y) < c$ |
| $R(x) > 0$ | $R(y) < 0$ | x.0.y | $I(x.0.y) < c$ |
| $R(x) = 0$ or $R(y) = 0$ | | x.0.y | $I(x.0.y) \leq c$ |

The proof for the entries in Table 1 is not difficult, and we illustrate a proof of the first row. In Table 1, we started with the assumptions that $I(x) \leq c$ and $I(y) \leq c$, from which it easily follows that $|R(x)| \leq c$ and $|R(y)| \leq c$. For the first row of Table 1, we have the assumptions that $R(x)<0$ and $R(y)<0$, so that $-c \leq R(x) \leq -1$ and $-c \leq R(y) \leq -1$. Because $R(y)=-R(\bar{y})$, the previous relationship may be re-written as $1 \leq R(\bar{y}) \leq c$ so that we have the two relationships $$-c \leq R(x) \leq -1,$$

$$1 \leq R(\bar{y}) \leq c.$$

Adding these two relationships yields $$-c+1 \leq R(x)+R(\bar{y}) \leq c-1.$$

But $R(x.1.\bar{y})=R(x)+1+R(\bar{y})$, from which it follows that $-c+2 \leq R(x.1.\bar{y}) \leq c$, and the entry for the last column in the first row of Table 1 follows. That is, $I(x.1.\bar{y}) \leq c$.

Other embodiments may have a table with different entries than those in Table 1. For example, it can be shown that for $R(x)=0$ or $R(y)=0$, the concatenation may be taken as x.1.y.

The motivation for the above mathematical framework is to provide a relationship between the imbalances I and metric B for any two words. More particularly, we show that if both of the imbalances of two equal length words are upper bounded by some number, then the metric B between those same two words is also upper bounded by the same upper bound. To this end, we again assume for any two words that $I(x) \leq c$ and $I(y) \leq c$, so that $|R(x)| \leq c$ and $|R(y)| \leq c$. From this, it follows that $$-c \leq O(x) - Z(x) \leq c,$$

$$-c \leq Z(y) - O(y) \leq c.$$

Adding the above two relationships yields $$-2c \leq (O(x)-O(y)) - (Z(x)-Z(y)) \leq 2c.$$

But, because both words x and y have the same length, $Z(x)+O(x)=Z(y)+O(y)$, from which $Z(x)-Z(y)=O(y)-O(x)$ follows. Using the previous equality in the above displayed equation yields $-2c \leq 2(O(x)-O(y)) \leq 2c$ from which $abs(O(x)-O(y)) \leq c$ follows. But, $abs(O(x)-O(y))=B(x,y)$, and therefore $B(x,y) \leq c$, which is the result to be proved. With the above mathematical framework presented, we now describe embodiments.

Example embodiments provide for encoding of words before they are to be transmitted on an I/O bus, where the encoded words have well bounded imbalances, thereby leading to a well bounded metric B between any two transmitted encoded words. The encoded words are then decoded upon reception to provide the desired words.

The above statement may be made more precise as follows. Let w denote a word of length n. The word w is encoded to a new word, which we may write as E(w), where E denotes the encoding operation. The length of E(w) is m, where in general m>n. The word E(w) is the actual word that is transmitted on the bus. Assuming that no errors are made, the word E(w) is received on the receiving end of the bus, whereby it is decoded by the inverse of E, resulting in the word w. (In a memory system, E(w) may be stored without decoding. Then, decoding is performed when E(w) is retrieved on a read operation.) Whereas the imbalance of the word w may be as high as n, example embodiments may provide E(w) with an imbalance of k, where k<n. For some embodiments, k may be substantially less than n. As a result, embodiments of the present invention are expected to provide a signaling scheme over an I/O bus with reduced power rail and ground voltage bounce when compared to a conventional single-ended signaling scheme.

It is useful to first describe a subset of an encoding embodiment. Referring to FIG. 1, two arbitrary words x and y have length k. Module 102x determines whether the residue of word x is positive, zero, or negative. For some embodiments, Module 102x is a majority encoder, providing a signal indicative of whether there are more or less 1's than 0's in word x. Similarly, module 102y, also a majority encoder for some embodiments, determines whether the residue of word y is positive, zero, or negative. This information is provided to logic module 104, which provides as output the conditional bit according to Table 1. For example, if module 102x indicates that $R(x)<0$ and $R(y)<0$, then the conditional bit 1 is indicated by the first row, third column of Table 1. If the conditional bit 1 and word y are provided as an input to exclusive-OR (XOR) module, then the output of XOR module is the bit-wise exclusive-OR of each bit of y with the conditional bit, which for the conditional bit 1 is $\bar{y}$. The bit-wise XOR of each bit of y with the conditional bit z is denoted as $z \oplus y$ The output of the encoder of FIG. 1 is the word x.z.(z $\oplus$ y), where logic module 104 implements Table 1. For the word x.z.(z $\oplus$ y), we have treated the conditional bit z as a word of length 1, so that x.z.(z $\oplus$ y) is interpreted as the concatenation or words x, z, and z $\oplus$ y. From the last column of Table 1, it is seen that the imbalance of x.z.(z $\oplus$ y) is bounded by k. The length of the word x.z.(z $\oplus$ y) is 2k+1. We see that the effect of the circuit of FIG. 1 is to take two words x and y, each of length k, and to provide the word x.z.(z $\oplus$ y) of length 2k+1 but with imbalance $I(x.z.(z \oplus y)) \leq k$.

Figure 2:
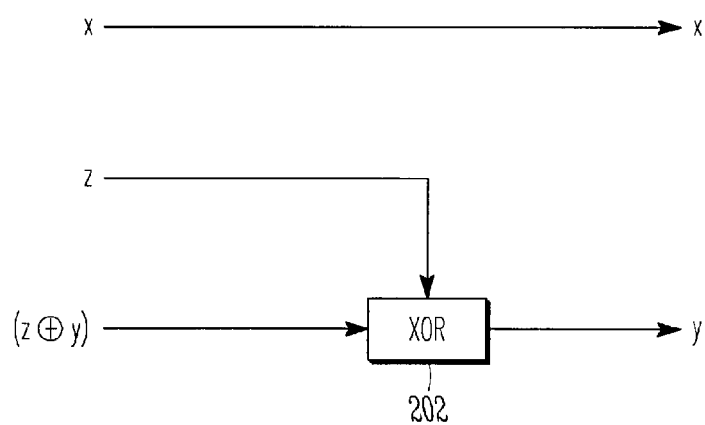
FIG. 2 illustrates a portion of an decoding circuit according to an example embodiment.

FIG. 2 illustrates a subset of a decoding embodiment. In a sense, FIG. 2 performs the inverse of FIG. 1, in which the word x.z.(z $\oplus$ y) is decoded into words x and y by "XORing" conditional bit z with the word z $\oplus$ y by using XOR module 202.

Figure 3:
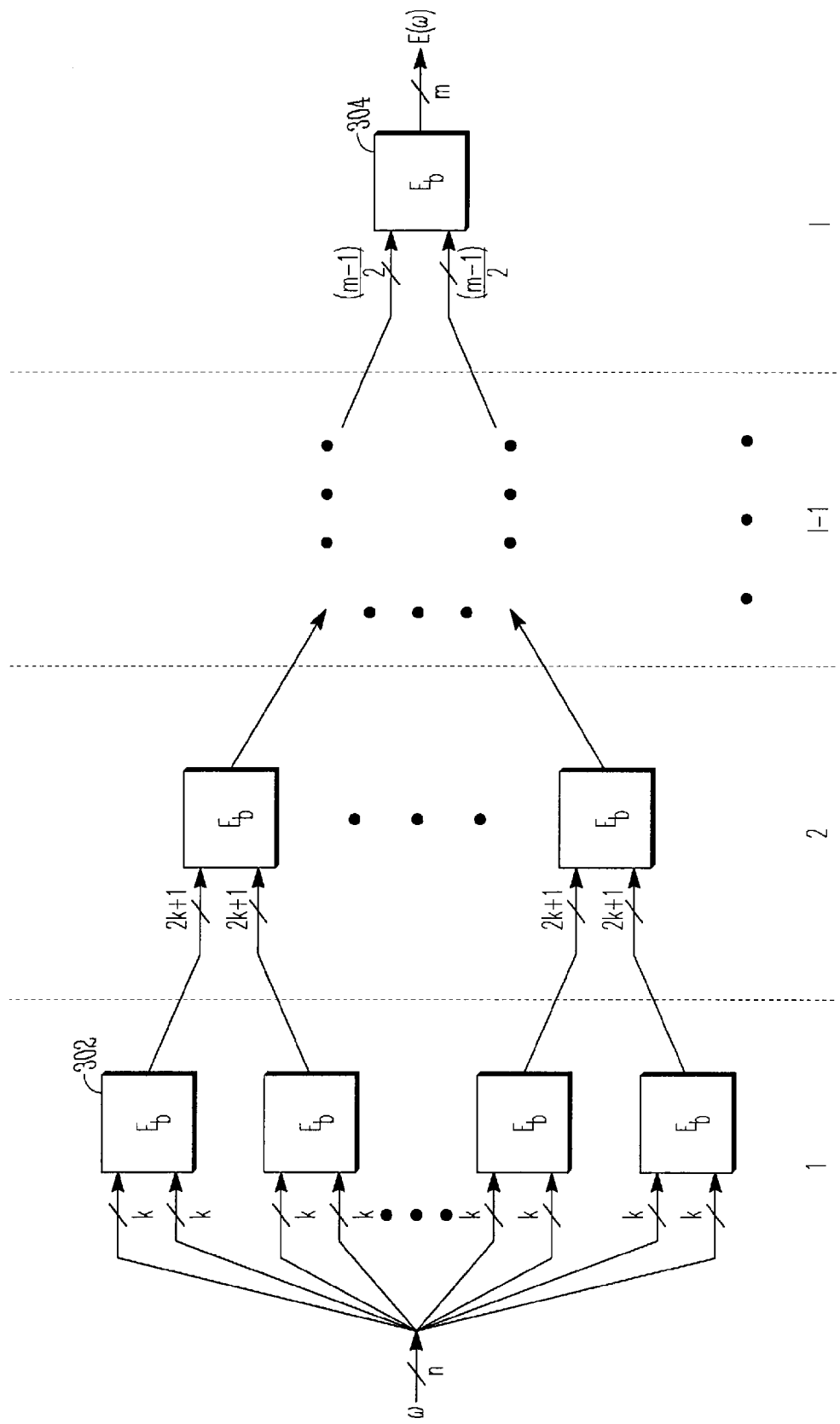
FIG. 3 illustrates an example encoding circuit according to an embodiment.

Repeated application of the partial encoding scheme of FIG. 1 leads to an embodiment encoder, illustrated in FIG. 3. The input to the encoder embodiment of FIG. 3 is a word w of length n, and the output is the word E(w) of length m, where m>n. Each module indicated by the symbol $E_b$ performs the partial encoding scheme of FIG. 1. The subscript on $E_b$ serves to indicate that the partial encoding operator $E_b$ operates on two words.

The encoder embodiment of FIG. 3 may be visualized as comprising l stages. In the first stage, word w is partitioned into a plurality of smaller words, each having length k. For example, the words provided to module 302 may be taken as the first group of k bits of w and the second group of k bits of w. From this example, it is clear how the other words are synthesized. (If the length of word w is not divisible by 2k, then extra bits may be added to w to form a new word divisible by 2k, which is then encoded. More particularly, if n/k is not a power of 2, then extra bits may be added to make it a power of 2.)

In the second stage, an output from one module in the first stage and another output from a second module in the first stage are taken as inputs to a module in the second stage. Note that for simplification of the drawing, adjacent modules in stage 1 are used to provide the input words to a corresponding module in stage 2. However, in other embodiments, the flow of words from one stage to the next may be different.

There are multiple stages in FIG. 3, so that in the final stage, indicated as stage l, two words, each of length (m−1)/2, are applied as inputs to module 304 to provide the output word E(w) of length m. In general, if n/k is a power of 2, m may be provided by the simple recursion using pseudo-code. Step 1: Initialize m←k. Step 2: Perform m←2m+1 a total of l times, where the number of stages l is $l=\log_2 (n/k)$.

Because each module performs the partial encoding operator $E_b$ of FIG. 1, the imbalance of E(w) is bounded by k. That is, $I(E(w)) \leq k$. But, the imbalance of w may be as high as n, where for most practical applications, k<n. Consequently, it is expected that the encoding scheme represented by the embodiment of FIG. 3 results in less ground and power rail voltage bounce as the I/O bus is driven from one word to the next. That is, if $w_1$ and $w_2$ are two words, then $B(E(w_1), E(w_2)) \leq k$, whereas $B(w_1, w_2) \leq n$. Consequently, the effect of encoding before transmission over a bus is to force a tighter bound on the metric between the two transmitted encoded words $E(w_1)$ and $E(w_2)$ than for the two corresponding unencoded words $w_1$ and $w_2$. A penalty of the encoding scheme is that additional bits are transmitted along the bus, so that the bus should be wide enough to encompass these additional bits. It is expected that this penalty is minor, particularly in comparison to the expected benefit in the reduction in ground and power rail voltage bounce.

Figure 4:
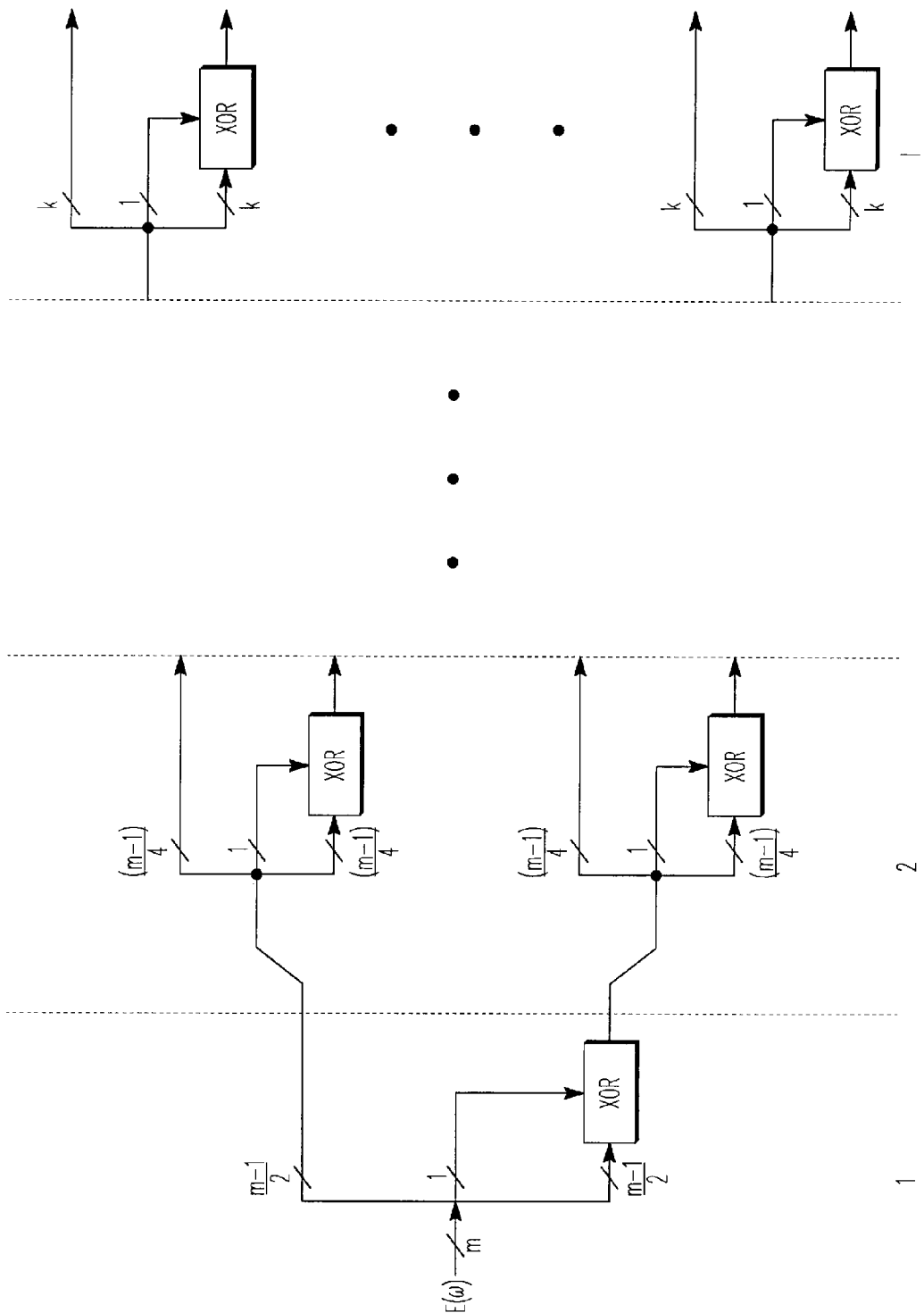
FIG. 4 illustrates an example decoding circuit according to an embodiment.
Figure 5:
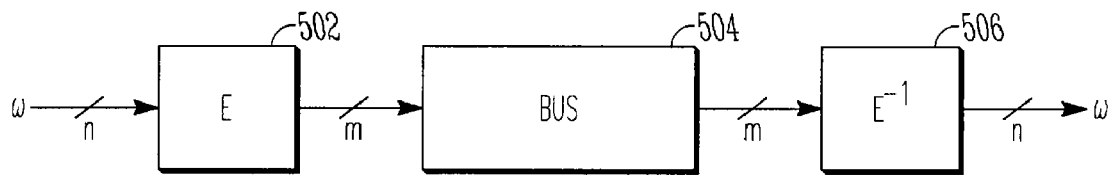
FIG. 5 illustrates a system level view of an example embodiment.

An example decoder embodiment is illustrated in FIG. 4, which is as a repeated application of the partial decoder of FIG. 2. Again, the decoder of FIG. 4 may be visualized as comprising l stages as indicated. The decoding operation of FIG. 4 may be written as $E^{-1}$. With this notation, the position of the encoder and decoder with respect to the bus is illustrated in FIG. 5. Word w of length n is encoded by encoder 502 into a word E(w) of length m, where m>n. Bus 504 is driven by word E(w). (For simplicity, drivers for bus 504 are not explicitly shown.) Word E(w) is then decoded by decoder 506 into the original word w, assuming that there have been no errors. (For simplicity, receivers at decoder 506 are not explicitly shown.)

Figure 6:
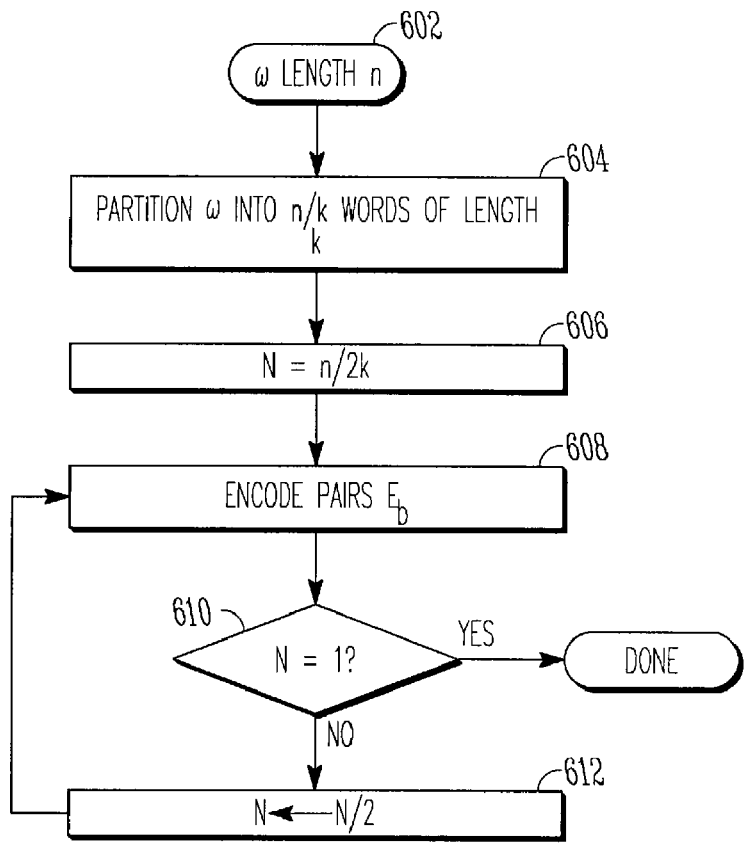
FIG. 6 is a flow diagram according to an example embodiment.

The encoding procedure outlined above may be illustrated by the flow diagram of FIG. 6. Starting with a word w of length n at block 602, the word w is partitioned at block 604 into n/k words, each of length k. Block 606 initializes the number of encoders $E_b$ in the first stage to N=n/2k. At block 608, a pair-wise encoding $E_b$ is performed on pairs of words, implementing Table 1. At block 610, a determination is made as to whether N=1. If this equality is true, the encoding procedure is done, but if the equality is not true, then the number of encoders in the next stage is divided by 2 so that N←N/2 in block 612, and control is brought to block 608 again.

Various circuits may be employed to implement the encoding and decoding procedure. For example, modules 102x and 102y, logic module 104, and XOR module 106, may be synthesized in many ways. For example, synthesizing digital logic to perform the functions of these modules is well known to one of ordinary skill in the art. The circuits may be hard-wired, or based upon programmable logic. Furthermore, some or all of these functions may be performed by a combination of digital and analog circuits.

Figure 7:
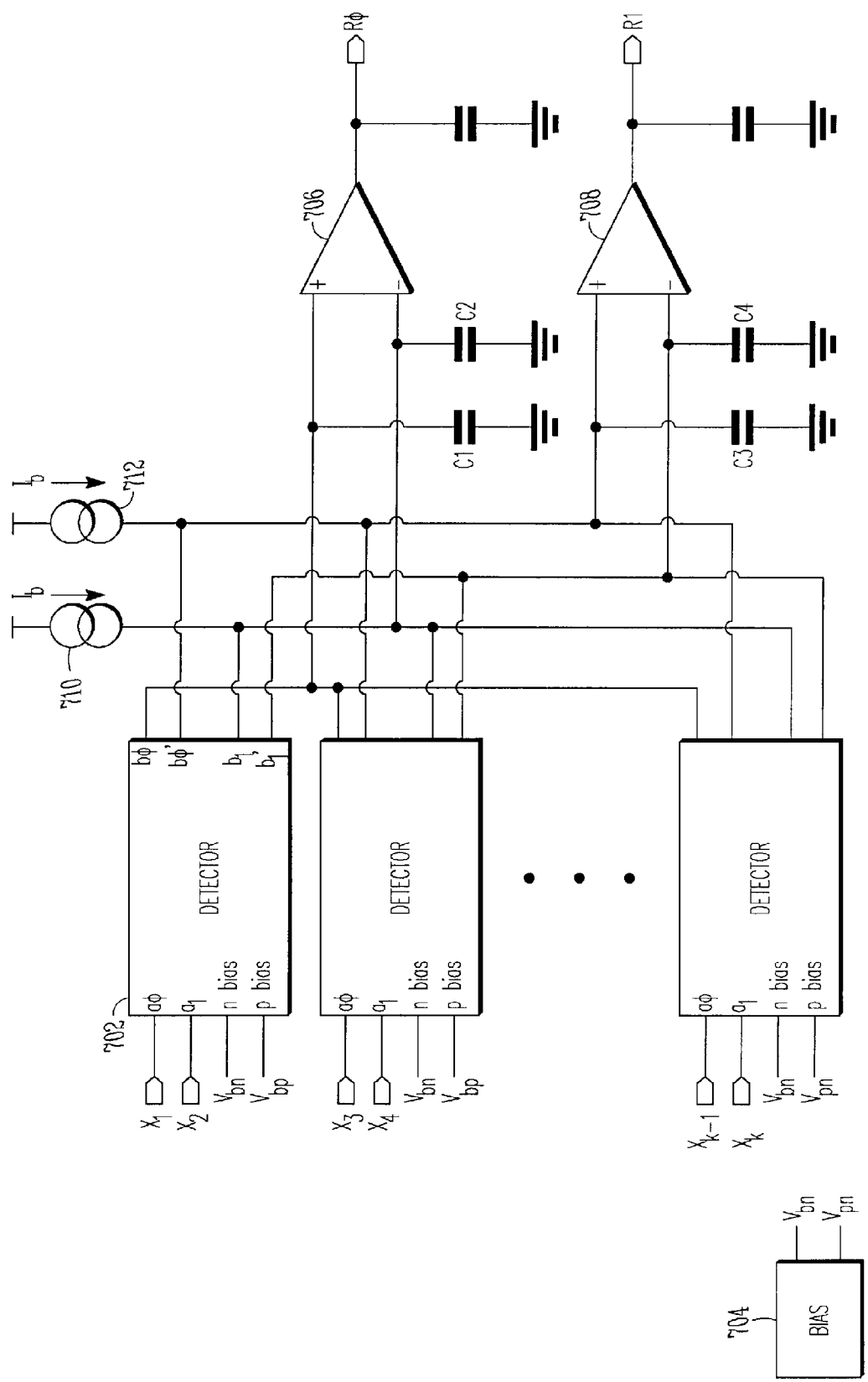
FIG. 7 is an example encoding circuit to implement the circuit of FIG. 1.

An example embodiment employing analog circuits may be described by reference to FIGS. 7 and 8. FIG. 7 provides a high-level circuit for majority modules 102x and 102y in FIG. 1. In FIG. 7, the bits of a word x are shown, where the length of x is taken as k. (The circuit of FIG. 7 assumes that k is even. For case of an odd k is discussed later.) Module 702 has two bits of the word x for an input, where we follow the convention that the bit 1 is represented by a HIGH voltage, and the bit 0 is represented by a LOW voltage. Module 702 is repeated in FIG. 7, k/2 times, each replication having another two bits of the word x as an input. Module 702 also has two bias voltages, indicated as $V_{bn}$ and $V_{bp}$, provided by bias circuit 704.

Module 702 has been termed a detector in FIG. 7. Its input ports, labeled as a0, a1, nbias, and pbias, are responsive to voltages, and its four output ports, labeled b0, b0', b1, and b1' output currents. The input-output relationship is illustrated in Table 2. A "H" for an output port indicates that current is being sourced out of the output port, that is, module 702 is coupling the output port to a current source. A "L" for an output port indicates that current is being sunk into the output port, that is, that module 702 is coupling the output port to a current sink. A "0" indicates that module 702 is neither coupling the output port to a current source nor a current sink, but that module 702 is "floating" the output port. (Because of the structure of the detector, b0 and b0' have the same entries, and b1 and b1' have the same entries.)

TABLE 2

| a0 | a1 | b0 and b0' | b1 and b1' |
|---|---|---|---|
| HIGH | HIGH | H | L |
| HIGH | LOW | 0 | 0 |
| LOW | HIGH | 0 | 0 |
| LOW | LOW | L | H |

The output ports of the detector modules in FIG. 7 are connected to one another so that corresponding output ports for each detector module are connected to each other. The sum of the b0 currents charge capacitor C1, the sum of the b1 currents charge capacitor C2, the sum of the b0' currents charge C3, and the sum of the b1 currents charge capacitor C4. Capacitor C1 is connected to the non-inverting input port of comparator 706, and capacitor C2 is connected to the inverting input port of comparator 706. Also, capacitor C3 is connected to the non-inverting input port of comparator 708, and capacitor C4 is connected to the inverting input port of comparator 708.

Current sources 710 and 712 inject a small bias current $I_b$, so that comparators 706 and 708 provide repeatable and definite outputs if there are an equal number of 1's and 0's in the word x. Labeling the output ports in FIG. 7 as R0 and R1, the behavior of the circuit of FIG. 7 is easily seen to be described as follows:

$R(x)>0 \Rightarrow \{R0=1, R1=1\}$, $R(x)<0 \Rightarrow \{R0=0, R1=0\}$, $R(x)=0 \Rightarrow \{R0=0, R1=1\}$.

The circuit of FIG. 7 provides an output indicative of the sign of the residue of the word x, or it indicates that the residue is zero. In this way, the circuit of FIG. 7 may be used to realize modules 102x and 102y in FIG. 1.

For the case in which k is odd, the circuit in FIG. 7 may be modified so that the module receiving the last bit of the word x sources or sinks a current less in magnitude than the other modules in FIG. 7. This statement may be made more precise as follows. Let $I_2$ denote the magnitude of the current that is sourced or sunk by any of the modules receiving two bits, let $I_1$ denote the magnitude of the current that is sourced or sunk by the module receiving only one bit when k is odd, and let $I_b$ denote the magnitude of the bias current. Then, for k even, it is desirable that $I_b<I_2$ so that $I_b$ does not affect the outcome when the residue is not zero. For k odd, it is desirable that $I_b<I_1$ and $I_b+I_1<I_2$.

Figure 8:
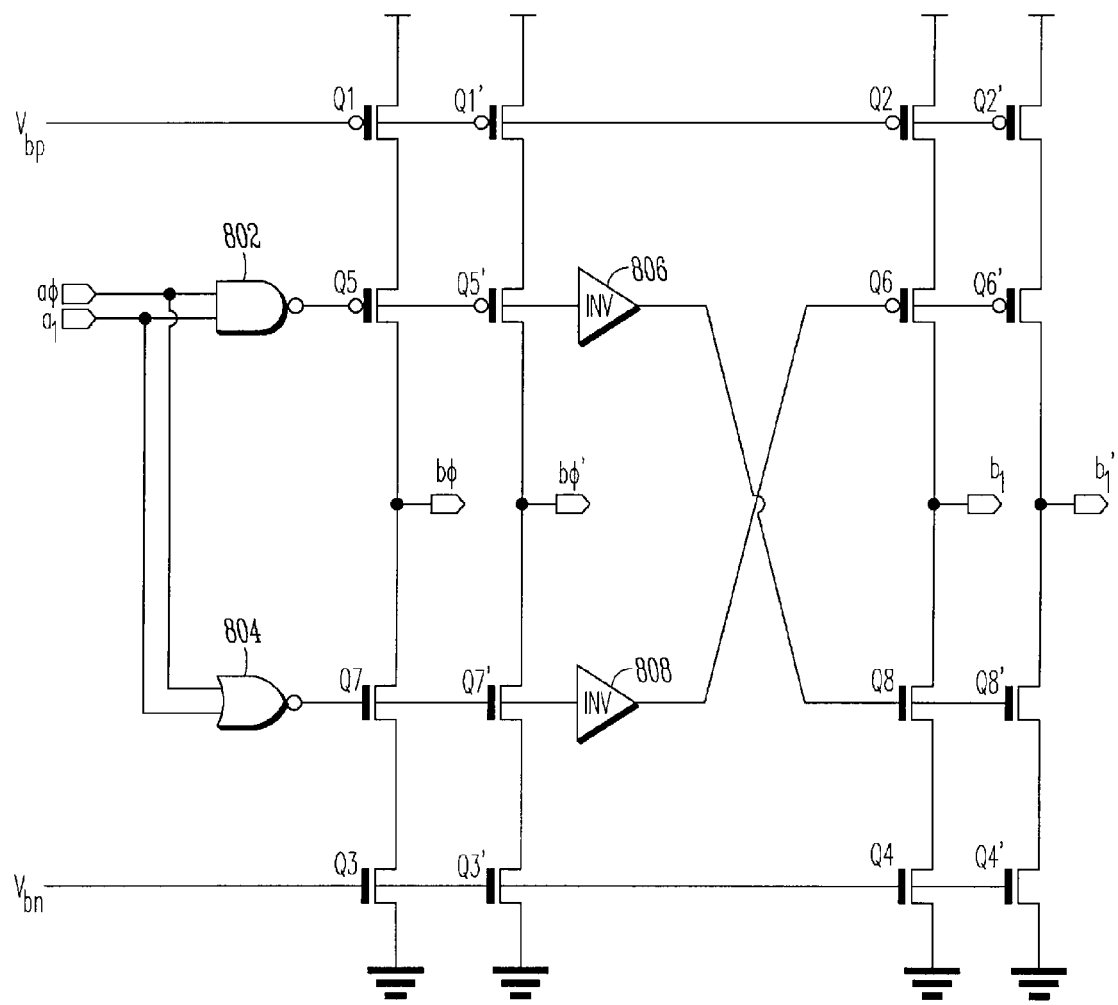
FIG. 8 is an example circuit at the transistor level to implement the circuit of FIG. 7.
Figure 9:
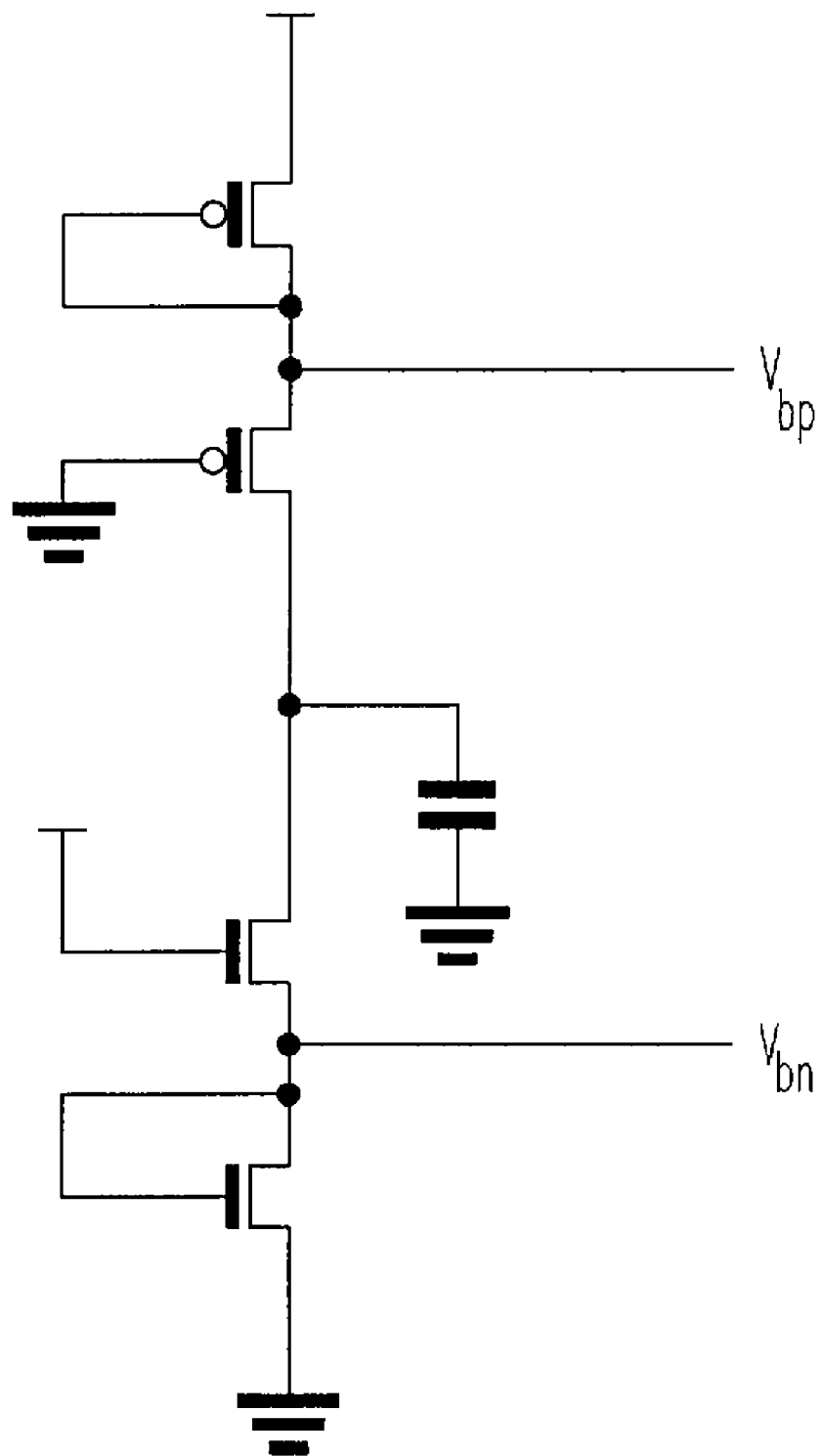
FIG. 9 is an example circuit to provide bias voltages to the circuit of FIG. 8.

An example circuit for detector module 702 is illustrated in FIG. 8. Input ports a0 and a1 are coupled to NAND gate 802 and NOR gate 804. A bias voltage $V_{bp}$ biases the gates of pMOSFETs (p-Metal-Oxide-Semiconductor-Field-Effect-Transistor) Q1 and Q2, and bias voltage $V_{bn}$ biases the gates of nMOSFETs Q3 and Q4. The bias voltages $V_{hp}$ and $V_{bn}$ may be generated in various ways. One such embodiment circuit is illustrated in FIG. 9. In the particular embodiment of FIG. 8, transistors Q1 and Q2 are matched, and transistors Q3 and Q4 are matched. By making these transistors relatively large, they are easier to match.

Output ports b0 and b1 are indicated in FIG. 8, where output port b0 is coupled to the drains of transistors Q5 and Q7, and output port b1 is coupled to the drains of transistors Q6 and Q8. With the arrangement of NAND gate 802, NOR gate 804, and inverters 806 and 808, it is straightforward to verify that transistors Q5, Q6, Q7, and Q8 are switched ON or OFF in such a manner that the input-output relationship for the circuit of FIG. 8 follows Table 2.

Similar remarks apply to transistors Q1' through Q8', and to output ports b0' and b1'.

Example embodiments may find applications in a number of systems. As one example, a common standard RAM (Random Access Memory) interface comprises 36 data bits. Usually, these 36 data bits are apportioned so that there are 4 bytes of data, with a parity bit for each byte. Used in this way, the imbalance of a word transmitted over an I/O bus to the RAM may be as large as 36. But, by employing an example in which 4 bytes of data (n=32) are partitioned into four words, each of length 8 (k=8), then by referring to the embodiment of FIG. 3, we see that the encoding may be accomplished in two stages, where three conditioning bits are added. Thus, three of the parity bits in a common RAM interface may be allocated as conditioning bits, and the imbalance is upper bounded by 8. With this encoding scheme, the "badness" metric B is only 25% that of the metric for the unencoded RAM interface. (If the remaining parity bit in the RAM interface is kept as a parity bit for the encoded word, then the imbalance is upper bounded by 9.) Encoded data may be stored in the normal manner in the RAM. On a read operation, the encoded data is retrieved from the RAM and may be decoded as described previously.

Various modifications may be made to the disclosed embodiments without departing from the scope of the invention as claimed below.

It is to be understood in these letters patent that the meaning of "A is connected to B", where A or B may be, for example, a node or device terminal, is that A and B are connected to each other so that the voltage potentials of A and B are substantially equal to each other. For example, A and B may be connected by way of an interconnect, for example. In integrated circuit technology, the interconnect may be exceedingly short, comparable to the device dimension itself. For example, the gates of two transistors may be connected to each other by polysilicon or copper interconnect that is comparable to the gate length of the transistors. As another example, A and B may be connected to each other by a switch, such as a transmission gate, so that their respective voltage potentials are substantially equal to each other when the switch is ON.

It is also to be understood in these letters patent that the meaning of "A is coupled to B" is that either A and B are connected to each other as described above, or that, although A and B may not be connected to each other as described above, there is nevertheless a device or circuit that is connected to both A and B. This device or circuit may include active or passive circuit elements, where the passive circuit elements may be distributed or lumped-parameter in nature. For example, A may be connected to a circuit element which in turn is connected to B.

It is also to be understood in these letters patent that a "current source" may mean either a current source or a current sink. Similar remarks apply to similar phrases, such as, "to source current".

It is also to be understood in these letters patent that various circuit modules, such as current mirrors, amplifiers, etc., may include switches so as to be switched in or out of a larger circuit, and yet such circuit modules may still be considered connected to the larger circuit because the various switches may be considered as included in the circuit module.

Various mathematical relationships are used to describe relationships among one or more quantities. For example, a mathematical relationship or mathematical transformation may express a relationship by which a quantity is derived from one or more other quantities by way of various mathematical operations, such as addition, subtraction, multiplication, division, etc. Or, a mathematical relationship may indicate that a quantity is larger, smaller, or equal to another quantity. These relationships and transformations are in practice not satisfied exactly, and should therefore be interpreted as "designed for" relationships and transformations. One of ordinary skill in the art may design various working embodiments to satisfy various mathematical relationships or transformations, but these relationships or transformations can only be met within the tolerances of the technology available to the practitioner.

Accordingly, in the following claims, it is to be understood that claimed mathematical relationships or transformations can in practice only be met within the tolerances or precision of the technology available to the practitioner, and that the scope of the claimed subject matter includes those embodiments that substantially satisfy the mathematical relationships or transformations so claimed.

What is claimed is:

1. An apparatus comprising:
an encoder to encode a first binary word and a second binary word into a third binary word, the first binary word having a length equal to that of the second binary word, the first binary word having a first imbalance and the second binary word having a second imbalance, wherein the third binary word has an imbalance upper bounded by the least upper bound of the first and second imbalances and the third binary word has a length equal to one plus twice the length of the first binary word.

2. The apparatus as set forth in claim 1, the first binary word having a first residue and the second binary word having a second residue, wherein the encoder comprises:
a first majority circuit to provide a signal indicative of whether the first residue is greater than zero, less than zero, or equal to zero; and
a second majority circuit to provide a signal indicative of whether the second residue is greater than zero, less than zero, or equal to zero.

3. The apparatus as set forth in claim 2, wherein the encoder further comprises:
a logic circuit to output, for a first case of the first and second residues, the third binary word as a concatenation of the first binary word, a first conditioning bit, and the logical complement of the second binary word; and for a second case of the first and second residues, to output the third binary word as a concatenation of the first binary word, a second conditioning bit, and the second binary word, wherein the first conditioning bit is the logical complement of the second conditioning bit.

4. The apparatus as set forth in claim 3, wherein for the first case of the first and second residues, the first and second residues have the same algebraic sign and each are not zero; and for the second case of the first and second residues, the first and second residues have opposite algebraic signs and each are not zero.

5. The apparatus as set forth in claim 4, further comprising:
a bus; and
a decoder to receive a received word on the bus, the received word having a length m, the received word having a middle bit and a portion comprising (m−1)/2 consecutive bits excluding the middle bit, the decoder to form the logical exclusive OR of the middle bit with the portion.

6. The apparatus as set forth in claim 1, further comprising:
a bus; and a decoder to receive a received word on the bus, the received word having a length m, the received word having a middle bit and a portion comprising (m−1)/2 consecutive bits excluding the middle bit, the decoder to form the logical exclusive OR of the middle bit with the portion.

7. An encoder to encode a first binary word and a second binary word into a third binary word, the first binary word having a first residue and the second binary word having a second residue, the encoder comprising:
    a first majority circuit to provide a signal indicative of whether the first residue is greater than zero, less than zero, or equal to zero;
    a second majority circuit to provide a signal indicative of whether the second residue is greater than zero, less than zero, or equal to zero; and
    a logic circuit to output, for a first case of the first and second residues, the third binary word as a concatenation of the first binary word, a first conditioning bit, and the logical complement of the second binary word; and for a second case of the first and second residues, to output the third binary word as a concatenation of the first binary word, a second conditioning bit, and the second binary word, wherein the first conditioning bit is the logical complement of the second conditioning bit.

8. The encoder as set forth in claim 7, wherein for the first case of the first and second residues, the first and second residues have the same algebraic sign and each are not zero; and for the second case of the first and second residues, the first and second residues have opposite algebraic signs and each are not zero.

9. The encoder as set forth in claim 8, further comprising:
    a bus; and
    a decoder to receive a received word on the bus, the received word having a length m, the received word having a middle bit and a portion comprising (m−1)/2 consecutive bits excluding the middle bit, the decoder to form the logical exclusive OR of the middle bit with the portion.

10. The encoder as set forth in claim 7, further comprising:
    a bus; and
    a decoder to receive a received word on the bus, the received word having a length m, the received word having a middle bit and a portion comprising (m−1)/2 consecutive bits excluding the middle bit, the decoder to form the logical exclusive OR of the middle bit with the portion.

11. A circuit to encode a word having a length, the circuit comprising:
    a stage to partition the word into smaller words each having a length less than the length of the word, each of the smaller words having a residue, the stage comprising a plurality of encoders, each encoder in the stage to encode a corresponding two of the smaller words into a corresponding larger word, each encoder to provide its corresponding larger word by concatenating a first of its corresponding smaller words with a first conditioning bit and the logical complement of a second of its corresponding smaller words provided the first and second residues of its first and second corresponding smaller words have the same algebraic signs and each are not zero, and by concatenating the first of its corresponding smaller words with a second conditioning bit and the second of its corresponding smaller words provided the first and second residues of its first and second corresponding smaller words have opposite algebraic signs and each are not zero, wherein the first conditioning bit is the logical complement of the second conditioning bit.

12. The circuit as set forth in claim 11, wherein each encoder comprises a plurality of detector circuits, wherein each detector circuit associated with an encoder is responsive to two bits of one of the two smaller words corresponding to the associated encoder, where each detector sources a first current and sinks a second current if a first of its associated two bits is a 1 and the second of the two bits is a 0.

13. A circuit to encode a word w having a length n, the circuit comprising:
    a first stage to partition the word w into n/k words w(i), i=1, ..., n/k each of length k where the concatenation w(1).w(2) ... w(n/k) forms the word w, the first stage comprising n/2k encoders E(i), i=1, ..., n/2k, wherein for each i=1, ..., n/2k, encoder E(i) encodes the words w(2i) and w(2i−1) into a word $w_1(i)$ of length 2k+1 having an imbalance of k.

14. The circuit as set forth in claim 13, the circuit comprising:
    a second stage comprising n/4k encoders $E_2$ (i), i=1, 2, ..., n/4k, wherein for each i=1, ..., n/4k encoder $E_2$ (i) encodes the words $w_1$(2i) and $w_1$(2i−1) into a word $w_2$(i) having an imbalance of k.

15. A circuit comprising:
    an encoder to encoder a word x having a residue and a word y having a residue into a word x.1.$\bar{y}$ provided the residues of the words x and y have the same algebraic sign, and into a word x.0.$\bar{y}$ provided the residues of the words x and y have opposite algebraic signs.

16. A method comprising:
    partitioning a word w having a length n into n/k words w(i), i=1, ..., n/k each of length k where the concatenation w(1).w(2), ..., w(n/k) forms the word w;
    for each i=1, ..., n/2k, encoding the words w(2i) and w(2i−1) into a word $w_1(i)$ of length 2k+1 having an imbalance of k; and
    transmitting the word $w_1(1)$ over a bus if and only if n/2k=1.

17. The method as set forth in claim 16, further comprising:
    for each l=2, ..., L where L=$\log_2$(n/k), for each i=1, ..., n/($2^l$k), encoding words $w_{l-1}$(2i) and $w_{l-1}$(2i−1) into a word $w_l$(i) of length Length(i) having an imbalance of k; and
    transmitting the word $w_L(1)$ over a bus,
    where for each i=2, ..., L, Length(i) may be given by the recursion Length(p+1)=2Length(p)+1 for p=1, ..., i−1 where Length(1)=2k+1.

18. An apparatus comprising:
    means for partitioning a word w having a length n into n/k words w(i), i=1, ..., n/k each of length k where the concatenation w(1).w(2), ..., w(n/k) forms the word w;
    for each i=1, ..., n/2k, means for encoding the words w(2i) and w(2i−1) into a word $w_1(i)$ of length 2k+1 having an imbalance of k; and
    means for transmitting the word $w_1(1)$ over a bus if and only if n/2k=1.

19. The apparatus as set forth in claim 18, further comprising:
    for each l=2, ..., L where L=$\log_2$(n/k), for each i=1, ..., n/($2^l$k), means for encoding words $w_{l-1}$(2i) and $w_{l-1}$(2i−1) into a word $w_l(i)$ of length Length(i) having an imbalance of k; and
    means for transmitting the word $w_L(1)$ over a bus,
    where for each i=2, ..., L, Length(i) may be given by the recursion Length(p+1)=2Length(p)+1 for p=1, ..., i−1 where Length(1)=2k+1.

20. An apparatus comprising:
L circuit stages stage(l), l=1, ..., L, where $L=\log_2 (n/k)$, wherein stage(1) partitions a word w having a length n into n/k words $w_0(i)$, i=1, ..., n/k each of length k; and
for each l=1, 2, ..., L, stage(l) comprises $n/(2^l k)$ circuit encoders $E_l(i)$, i=1, ..., $n(2^l k)$, where for each l=1, 2, ..., L, for each i=1, ..., $n(2^l k)$, $E_l(i)$ encodes the words $w_{l-1}(2i)$ and $w_{l-1}(2i-1)$ into a word $w_l(i)$ of a length Length(i) having an imbalance of k, where for each i=2, ..., L, Length(i) may be given by the recursion Length(p+1)=2Length(p)+1 for p=1, ..., i−1 where Length(1)=2k+1.

21. The apparatus as set forth in claim 20, further comprising:
a bus, wherein stage(L) is coupled to the bus to transmit the word $w_L(1)$ over the bus.

* * * * *

UNITED STATES PATENT AND TRADEMARK OFFICE
CERTIFICATE OF CORRECTION

| | | |
|---|---|---|
| PATENT NO. | : 7,600,181 B2 | Page 1 of 1 |
| APPLICATION NO. | : 11/421431 | |
| DATED | : October 6, 2009 | |
| INVENTOR(S) | : Alleyne et al. | |

It is certified that error appears in the above-identified patent and that said Letters Patent is hereby corrected as shown below:

On the title page, item (74), in "Attorney, Agent, or Firm", in column 2, line 1, delete "Lunbderg" and insert -- Lundberg --, therefor.

In column 2, line 30, delete "R(x,y)" and insert -- R(x.y) --, therefor.

In column 4, line 3, after "y" insert -- . --.

In column 10, line 26, in Claim 15, delete "encoder" and insert -- encode --, therefor.

In column 10, line 43, in Claim 17, delete "$w_1(i)$" and insert -- $W_l(i)$ --, therefor.

In column 10, line 62, in Claim 19, delete "$w_1(i)$" and insert -- $W_l(i)$ --, therefor.

In column 11, line 3, in Claim 20, delete "stage(1)" and insert -- stage(l) --, therefor.

Signed and Sealed this

Fifth Day of January, 2010

David J. Kappos
*Director of the United States Patent and Trademark Office*

UNITED STATES PATENT AND TRADEMARK OFFICE
CERTIFICATE OF CORRECTION

PATENT NO.       : 7,600,181 B2                                        Page 1 of 1
APPLICATION NO.  : 11/421431
DATED            : October 6, 2009
INVENTOR(S)      : Alleyne et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 793 days.

Signed and Sealed this

Fifth Day of October, 2010

David J. Kappos
*Director of the United States Patent and Trademark Office*